(12) United States Patent
Ueno

(10) Patent No.: US 7,944,756 B2
(45) Date of Patent: May 17, 2011

(54) NON-VOLATILE SEMICONDUCTOR MEMORY DEVICE

(75) Inventor: Koki Ueno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 52 days.

(21) Appl. No.: 12/564,612

(22) Filed: Sep. 22, 2009

(65) Prior Publication Data

US 2010/0232230 A1    Sep. 16, 2010

(30) Foreign Application Priority Data

Mar. 11, 2009  (JP) .................................. 2009-058362

(51) Int. Cl.
*G11C 16/00* (2006.01)

(52) U.S. Cl. .......... 365/185.22; 365/185.19; 365/185.24

(58) Field of Classification Search ............... 365/185.02
See application file for complete search history.

(56) References Cited

U.S. PATENT DOCUMENTS

| 6,621,742 | B1 * | 9/2003 | Yamada ................... 365/185.22 |
| 6,643,188 | B2 | 11/2003 | Tanaka et al. |
| 7,116,581 | B2 * | 10/2006 | Suzuki et al. ............ 365/185.19 |
| 7,170,780 | B2 * | 1/2007 | Kawai ....................... 365/185.03 |

OTHER PUBLICATIONS

U.S. Appl. No. 12/723,112, filed Mar. 12, 2010, Ueno, et al.

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

When data is written to a memory cell transistor, a write controller controls in such a manner that a verification operation subsequent to a program operation is carried out while a program voltage is increased stepwise for each program operation. The write controller controls in such a manner that a verification operation subsequent to a program operation by which a threshold voltage of a memory cell transistor to be written has become equal to or higher than a verification level for the first time is carried out twice or more at the same verification level, verification operations of the second and subsequent times are carried out after a second program operation which is carried out with the memory cell transistor set in an unselected state.

12 Claims, 10 Drawing Sheets

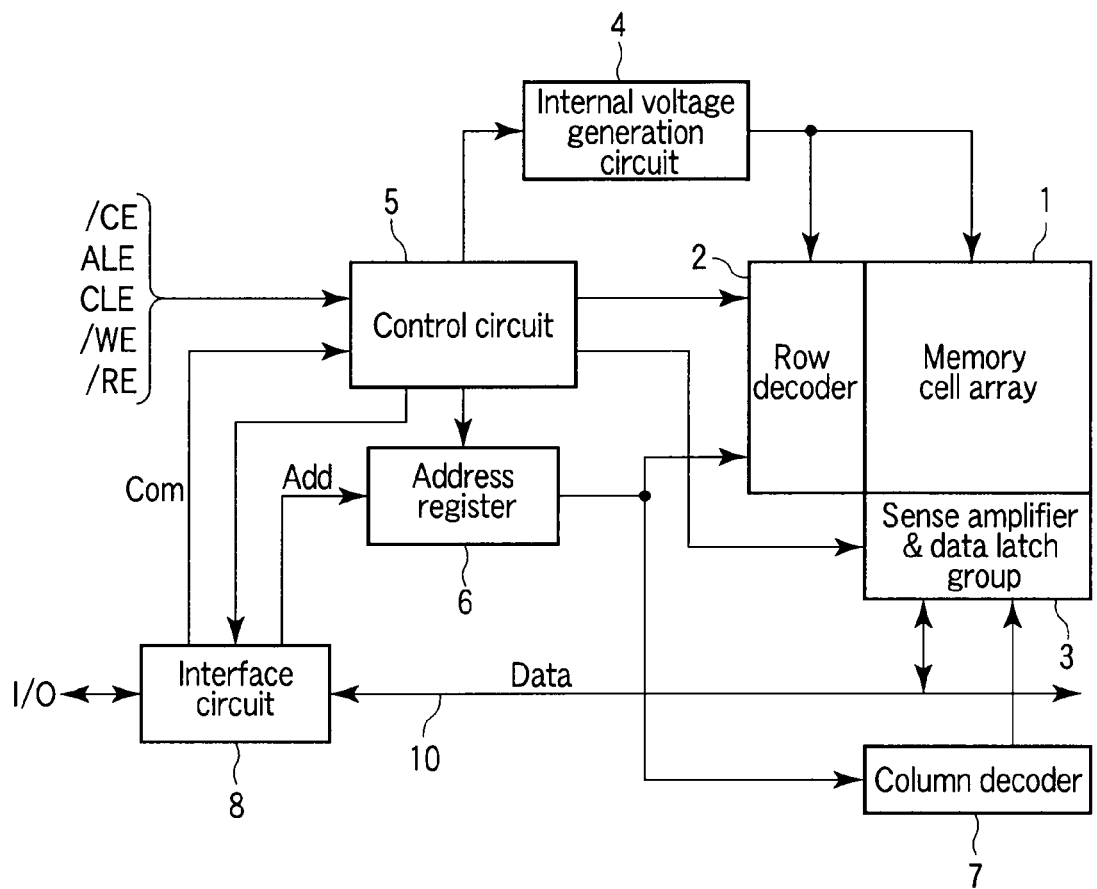
F I G. 1

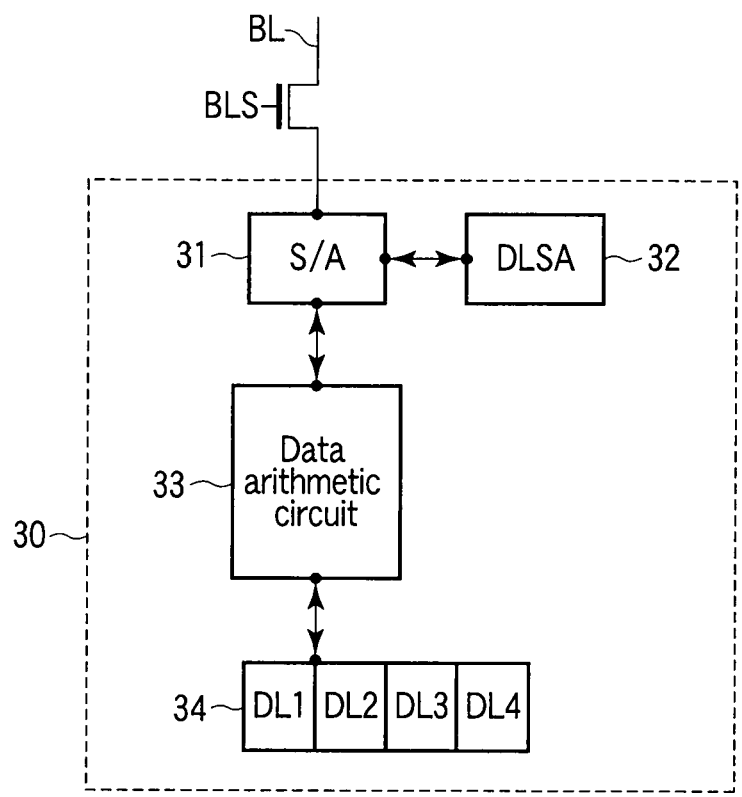
F I G. 3
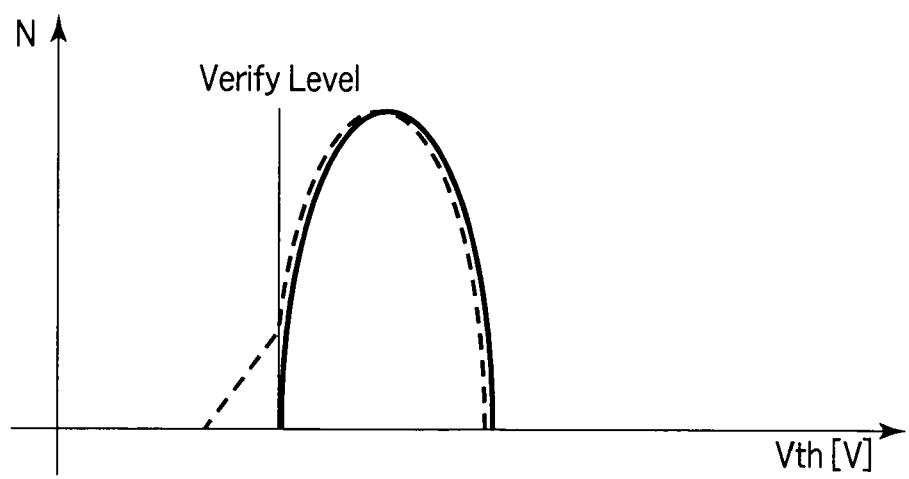
F I G. 4

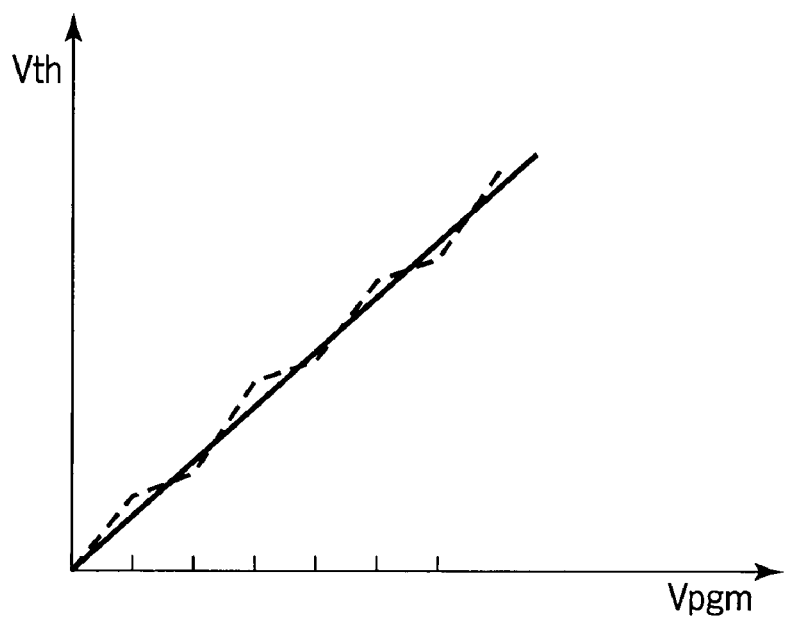
F I G. 11
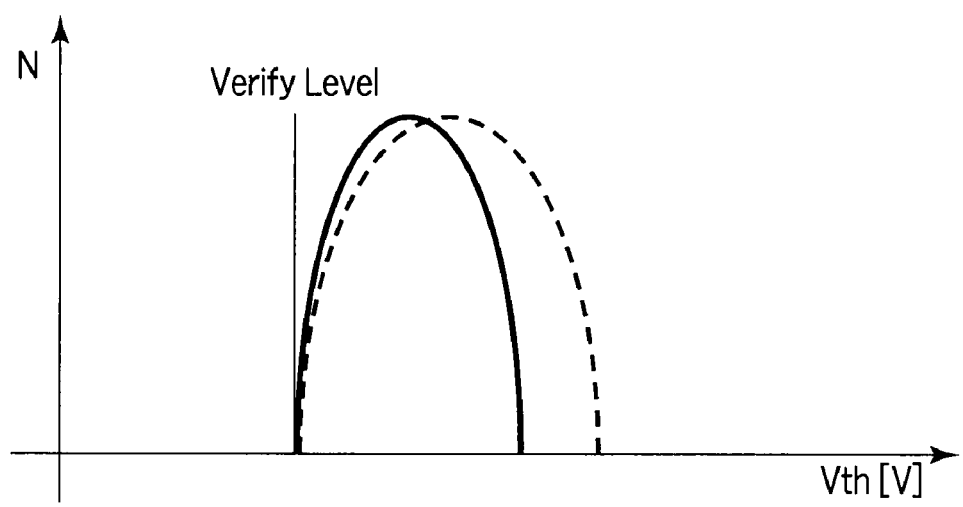
F I G. 12

NON-VOLATILE SEMICONDUCTOR MEMORY DEVICE

CROSS-REFERENCE TO RELATED APPLICATIONS

This application is based upon and claims the benefit of priority from prior Japanese Patent Application No. 2009-058362, filed Mar. 11, 2009, the entire contents of which are incorporated herein by reference.

BACKGROUND OF THE INVENTION

1. Field of the Invention

The present invention relates to a non-volatile semiconductor memory device and, more particularly, to a write controller for carrying out write control of a memory cell.

2. Description of the Related Art

Among non-volatile semiconductor memories, a NAND flash memory is known for its capability to cope with an increasing memory capacity and high integration. In a chip of the NAND flash memory, a plurality of NAND memory cells (hereinafter referred to as NAND cells) is arranged in a cell array area. Each of the NAND cells includes a plurality of memory cell transistors each having a stacked gate structure constituted of a floating gate and control gate, and connected in series, and select transistors connected to both ends of the plurality of memory cell transistors.

When data is written to the NAND cell, a system for carrying out control in such a manner that a program operation and a verification operation are alternately repeated is used in order to narrow the distribution width of the threshold voltage of the memory cell transistors. A plurality of the program operations and a plurality of the verifications operation are collectively called a write operation in some cases. In this case, the program operation is carried out in several times while the program voltage (Vpgm) is gradually stepped up. That is, the program operation is carried out while the program voltage (Vpgm) is stepped up, and the verification operation is carried out after each program operation. The verification operation implies an operation for confirming whether or not the threshold voltage of the memory cell transistor could have been written (increased) to a target value. In this case, if the target value is not attained, the program operation and the verification operation are carried out again. On the other hand, if it is determined that the program has been carried out to the target value, a voltage close to the power supply voltage is applied to a bit line BL connected to the NAND cell at the time of the next program, and the channel of the memory cell transistor is brought into a boosted state in order that the memory cell transistor in the unselected state can be prevented from being additionally programmed.

It should be noted that normally, in order to allow a program margin to the NAND cell, the reference level (verification level) for judging the read data at the time of the verification operation is set at a voltage higher than the judgment reference level at the time of a normal read operation to a certain degree.

However, due to the variation of the process and the circuit, the amount of change in the threshold voltage of the memory cell transistor becomes non-proportional with respect to a step-up in the program voltage (dVpgm), and the write operation may be terminated at a value lower than the target value in some cases. As a result of this, it becomes impossible to keep the threshold voltage within the target threshold voltage distribution width, and thus the reliability and performance are deteriorated. If it is intended to allow a margin for the lowering of the threshold voltage due to the above variation, the write operation must be carried out until a higher threshold voltage is obtained, leading to the other problem such as lowering of the yield.

It should be noted in U.S. Pat. No. 6,643,188, Tanaka et al., it is disclosed that a verification circuit for confirming the state of the memory cell after a write operation, and a data update circuit for updating the contents of a write data circuit to carry out rewrite to a memory cell insufficiently written on the basis of the contents of the write data circuit, and state of the memory cell after the write operation are provided, and the write operation based on the contents of the write data circuit, a write verification operation, and update of the contents of the write data circuit are repeated until the memory cell is brought into a predetermined written state.

BRIEF SUMMARY OF THE INVENTION

According to a first aspect of the present invention, there is provided a non-volatile semiconductor memory device, comprising:

a memory cell array in which a plurality of memory cell transistors are arranged; and a write controller configured to control in a write operation that a verification operation subsequent to a program operation is carried out with a program voltage increasing stepwise for each program operation, wherein the write controller controls that a first verification operation is carried out at a first verification level for a memory cell transistor to be written, subsequently to the first verification operation, a program operation is carried out with the memory cell transistor set in an unselected state, and a verification operation for the memory cell transistor subsequent to the program operation is carried out as a second verification operation at the first verification level.

According to a second aspect of the present invention, there is provided a non-volatile semiconductor memory device, comprising:

a memory cell array in which a plurality of memory cell transistors are arranged; and a write controller configured to control in a write operation that a verification operation subsequent to a program operation is carried out with a program voltage increasing stepwise for each program operation, a half-select write operation is carried out in a half-selected state where a given intermediate voltage lower than the power supply voltage is applied to a bit line connected to the memory cell transistor, and a first verification level, and a second verification level lower than the first verification level are set, wherein the write controller controls that a program operation subsequent to a first program operation that is a program operation by which a threshold voltage of a memory cell transistor to be written has become equal to or higher than the second verification level for the first time is carried out as a second program operation by the half-select write operation, a verification operation subsequent thereto is carried out as a first verification operation by using the first verification level as a point of reference, further a third program operation is carried out with the memory cell transistor to be written set in an unselected state, and a verification operation subsequent thereto is carried out as a second verification operation by using the first verification level as the point of reference.

According to a third aspect of the present invention, there is provided a non-volatile semiconductor memory device, comprising:

a memory cell array in which a plurality of memory cell transistors are arranged; and a write controller configured to control in a write operation that a verification operation subsequent to a program operation is carried out with a program voltage increasing stepwise for each program operation, a half-select write operation is carried out in a state where a predetermined intermediate voltage lower than the power supply voltage is applied to a bit line connected to the memory cell transistor, and a first verification level, and a second verification level lower than the first verification level are set, wherein the write controller controls that a verification operation subsequent to a program operation carried out for a memory cell transistor subsequently to a program operation by which a threshold voltage of the memory cell transistor of a write object has become equal to or higher than the second verification level for the first time is carried out by using the first verification level as a point of reference, and if the verification operation fails, a program operation is carried out by a half-select write operation to be carried out in a half-selected state where a given intermediate voltage lower than the power supply voltage is applied to a bit line connected to the memory cell transistor.

BRIEF DESCRIPTION OF THE SEVERAL VIEWS OF THE DRAWING

FIG. 1 is a block diagram of a NAND flash memory according to an embodiment of the present invention;

FIG. 3 is a block diagram schematically showing one set of a sense amplifier and data latch circuit extracted from FIG. 2;

FIG. 4 is a view showing the threshold voltage distribution state caused by the influence of noise of the memory cell transistors;

FIG. 11 is a characteristic diagram showing an example of a relationship between the step-up of the program voltage and threshold voltage of the memory cell transistor; and FIG. 12 is a characteristic diagram showing an example of each of an ideal threshold voltage distribution width and actual threshold voltage distribution width of the memory cell transistors.

DETAILED DESCRIPTION OF THE INVENTION

The present invention will be described below by way of various embodiments with reference to the accompanying drawings. In the description, parts common throughout all the drawings will be denoted by common reference symbols.

Figure 2:
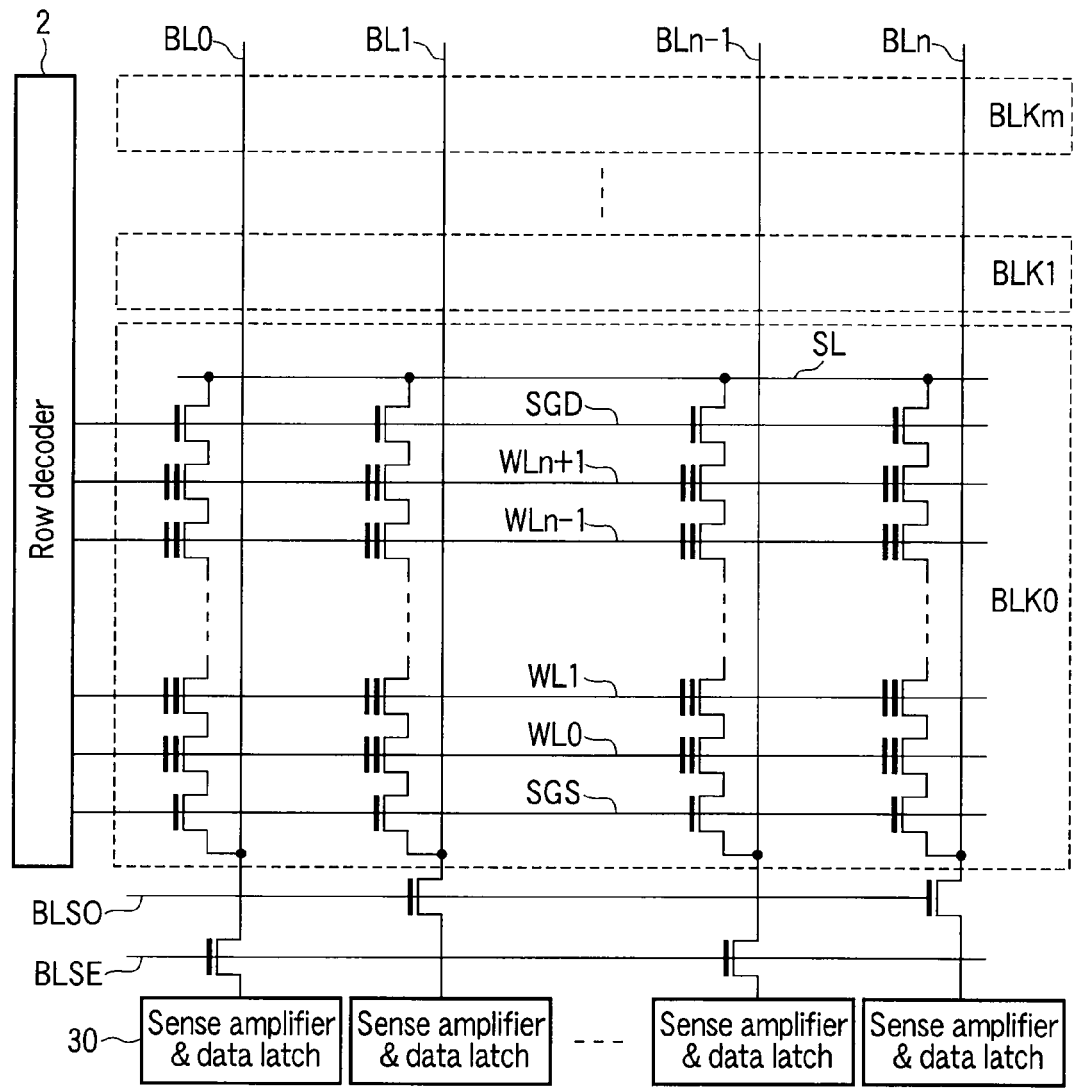
FIG. 2 is a block circuit diagram schematically showing extracted part of a core part of the memory of FIG. 1.

FIG. 1 is a block diagram showing the schematic configuration of a NAND flash memory according to an embodiment of the present invention. FIG. 2 is a block circuit diagram schematically showing extracted part of the core part of a memory of FIG. 1.

The NAND flash memory is configured to include a memory cell array 1, row decoder 2, sense amplifier & data latch group 3, internal voltage generation circuit 4, control circuit 5, address register 6, column decoder 7, interface circuit 8, and the like.

The memory cell array 1 is divided into a plurality of memory cell blocks BLK0 to BLKm as shown in FIG. 2. In each of the memory cell blocks BLK0 to BLKm, a plurality of NAND cells are arranged in a matrix form. The NAND cells are formed in such a manner that a plurality of memory cell transistors adjacent to each other are connected in series to share a source and a drain with each other. Each of drains on one end side of the NAND columns is connected to each of bit lines BL0 to BLn through each of a plurality of first select transistors. Each of sources on the other end side of the NAND columns is connected to a cell source line SL as common connection through each of a plurality of second select transistors. Each of select gate lines SGS and SGS provided to extend in the row direction of the memory cell array 1 is connected to a gate of each of first and second select transistors of the same rows, respectively as common connection. Each of a plurality of word lines WL0 to WLn+1 provided to extend in the row direction of the memory cell array 1 is connected to a control gate of each of memory cell transistors of the same rows. Here, a plurality of memory cell transistors connected to one word line constitute one page, and memory cell transistors of the number corresponding to a plurality of pages constitute one block of the memory cell blocks BLK0 to BLKm. It should be noted that writing or reading to or from the memory cell array 1 is carried out in units of pages, and erasing is carried out in units of blocks.

In this embodiment, as shown in FIG. 3, one sense amplifier & data latch 30 provided in the sense amplifier & data latch group 3 is connected to each of the bit lines BL (BL0 to BLn) through a column select transistor controlled by a select signal BLS. Here, a column select signal line BLSO is connected to a gate of a column select transistor of an odd number column, and a column select signal line BLSE is connected to a gate of a column select transistor of an even number column. At the time of a write operation, the sense amplifier & data latch group 3 latches data corresponding to one page of cell data (program data) to be written. Further, at the time of read, the sense amplifier & data latch group 3 latches data corresponding to one page of cell data read out to each bit line from a selected memory cell block BLK0 to BLKm in the memory cell array 1.

To the interface circuit 8, various commands, a row address signal, cell data to be written, and the like are input, each of address signals (row address signal and column address signal) Add is supplied to the address register 6 to be latched therein, and a command Com is supplied to the control circuit 5 to be latched therein. Further, the interface circuit 8 is supplied with data Data read from the memory cell array 1, and latched by the sense amplifier & data latch group 3 through a data line 10, and outputs the data Data.

The control circuit 5 includes a command register, command decoder, status register, and the like, and various control signals (a chip enable signal/CE, command latch enable signal CLE, address latch enable signal ALE, write enable signal/WE, read enable signal/RE, and the like) are input thereto from outside. The command register latches command data, and command decoder decodes a supplied command to determine an operation mode of the flash memory, and generate control signals for controlling an overall operation of the flash memory in accordance with the operation mode. On the basis of these control signals, a read operation, a write operation, an erase operation, and a verification operation of each circuit in the memory, the internal voltage generation circuit 4, and the like are controlled.

The internal voltage generation circuit 4 generates internal voltages on the basis of the control signals. For example, at the time of the write operation, the internal voltage generation circuit 4 generates high voltages such as a program voltage, a transfer voltage, and the like, and supplies the voltages to the row decoder 2 and memory cell array 1.

A row address signal (block address signal, page address signal) latched by the address register 6 is supplied to the row decoder 2 together with the operation mode signal, and is decoded therein. The row decoder 2 selects a memory cell block BLK0 to BLKm, and a page in the memory cell array 1, and controls the potentials of the word lines WL0 to WLn+1, and select gate lines SGD and SGS in the selected block. Further, a column address signal latched by the address register 6 is supplied to the column decoder 7 to be decoded. The column decoder 7 selects a column of the memory cell array 1 on the basis of the column address signal.

FIG. 3 is a block diagram schematically showing one sense amplifier & data latch 30 extracted from the sense amplifier & data latch group 3 in FIG. 2. In the sense amplifier & data latch 30, a sense amplifier (S/A) 31 is connected to a bit line BL through a column select transistor, and is connected to a data latch (DLSA) 32 which is a data latch on the sense amplifier side. The data latch 32 retains data for charging/discharging the bit line BL, or data sensed by the sense amplifier.

Further, a data latch 34 constituted of a plurality of latches (in this example four latches DL1, DL2, DL3, and DL4) is connected to the sense amplifier 31 through a data arithmetic circuit 33. As for the number of latches in the data latch 34, when information of n bits (n is an integer equal to or larger than 2) is programmed in one memory cell in the memory cell array, at least n latches are required to store program data supplied from an external bus. In this example, two latches (DL1, DL2) required to carry out a program of 2 bits/cell, and further two latches (DL3, DL4) required to retain a determination result (flag) of the data arithmetic circuit 33 are shown. It should be noted that when a program of 1 bit/cell is to be carried out, the number of the latches may be three (DL1, DL2, DL3). The data arithmetic circuit 33 is provided with a write control function to be described below.

Here, an operation of the sense amplifier & data latch group 3 of FIG. 3 will be described below. Program data supplied from the external bus is input to the latches DL1, DL2 in the data latch 34. The data arithmetic circuit 33 carries out control to determine at which of 0 V (Vss), Vinhibit to be described later, and VQPW to be described later the potential Vbl of the bit line BL connected to the sense amplifier & data latch 30 is to be set on the basis of the program data, transfer a determination result to the data latch 32, and further transfer the data of the data latch 32 to the sense amplifier 31.

As shown in FIG. 2, control gates of memory cell transistors in the same row are connected to any one of the word lines WL0 to WLn+1 as common connection, and at the time of the write operation, the memory cell transistors in the same row are simultaneously subjected to the write operation. In this case, in a memory cell transistor with a high write speed, the number of program loops required until the write operation to the target threshold voltage is completed is small. Conversely, in a memory cell with a low write speed, a large number of program loops are required until the write operation to the target threshold voltage is completed.

FIG. 4 is a view showing the threshold voltage distribution state of the memory cell transistors to explain the influence of the variation at the time of the write operation to the NAND cell. In the NAND flash memory, the write operation is terminated at a value lower than the target threshold voltage Vth [V] in some cases as shown by a broken line in FIG. 4 due to the variation of the process and the circuit.

Thus, in the present invention, as will be described in the following example, at the time of the write operation, the control circuit 5 controls the overall circuit to repeat the verification operation a plurality of times. As a result of this, even when the write operation is terminated at a low threshold voltage as it is during a first verification operation due to the influence of the variation, it becomes possible to be hardly influenced by the variation, and keep the threshold voltage within the target threshold voltage distribution width as shown by a solid line in FIG. 4. Various embodiments will be described below with respect to the program operation and the verification operation.

First Embodiment

Figure 5:
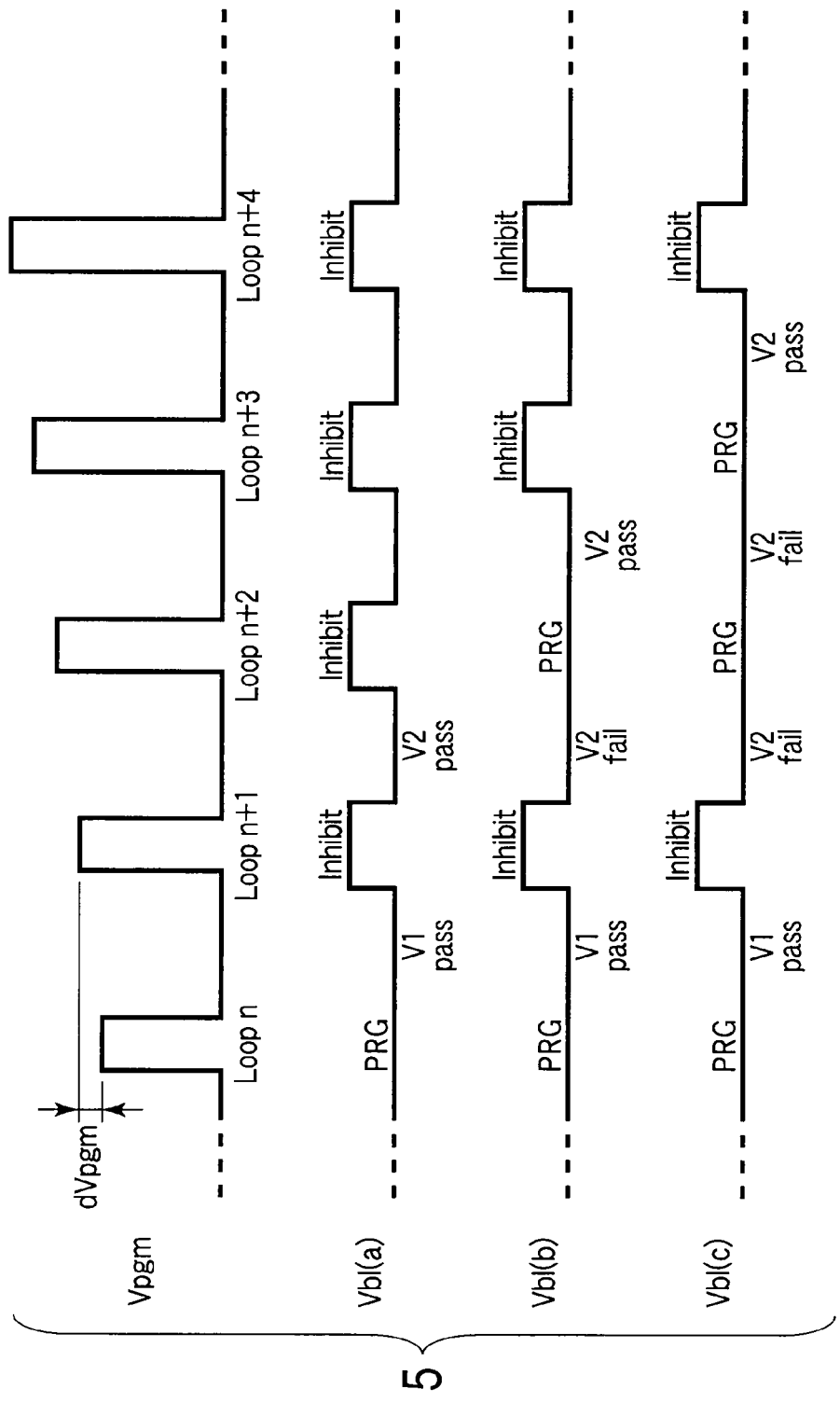
FIG. 5 is a timing chart showing program operations and verification operations in the NAND flash memory according to a first embodiment.

FIG. 5 is a timing chart showing program operations and verification operations in the NAND flash memory according to a first embodiment. In this embodiment, a verification operation is carried out twice or more at the same verification level after a program (PRG) operation (first program operation) by which the threshold voltage of the memory cell transistor to be written has reached the verification level for the first time, while the program voltage (Vpgm) applied to a control gate of a memory cell transistor which is selected by any one of the word lines WL0 to WLn+1 is stepped up. In this case, the verification operations of the second and subsequent times are carried out after the program operation (second program operation) subsequent to the first program operation, and the program operation and the verification operation are repeated until the verification operation passes (the threshold voltage of the memory cell transistor to be written becomes equal to or higher than the verification level).

That is, as shown by the bit line potential Vbl(a) in FIG. 5, if a first verification operation (V1) carried out after the nth (nth loop) program operation of the program loop has completed, the program operation of the (n+1)th loop is carried out after bringing the channel of the memory cell transistor to be written into the boosted state (the state where no program occurs, i.e., the unselected state) by applying a select inhibit voltage (inhibit voltage: about 3.0 V) to the bit line BL.

After this, a second verification operation (V2) is carried out, and if the verification operation (V2) has also passed like the verification operation (V1), a program operation is not carried out thereafter. Conversely, if the verification operation (V2) of the (n+1)th loop has failed, a program operation (PRG) is carried out again for the (n+2)th loop as shown by the bit line potential Vbl(b) in FIG. 5. Likewise, if the verification operation (V2) successively fails in the (n+1)th loop and (n+2)th loop, the program operation and the verification operation are repeated until the verification operation (V2) passes as shown by the bit line potential Vbl(c) in FIG. 5. It should be noted that in this embodiment, although the verification operation subsequent to the first program operation is carried out twice, the number of times of the verification operation subsequent to the first program operation may be increased to three times or more as the need arises.

As described above, in the first embodiment, in the NAND flash memory provided with the control circuit 5 for carrying out control, at the time of writing data to the NAND cell, in such a manner that the verification operation subsequent to the program operation is carried out while the write voltage is increased stepwise for each program operation, the control circuit 5 carries out control to repeat the program operation and the verification operation subsequent thereto until the verification operations of the second and subsequent times to be carried out after the first program operation passes. That is, the control circuit 5 carries out control in such a manner that the verification operation subsequent to the first program operation is carried out twice or more at the same verification level, and the verification operations of the second and subsequent times are carried out after the second program operation. Further, control is carried out in such a manner that if the second verification operation subsequent to the second program operation has passed, the write operation is terminated, and if the second verification operation subsequent to the second program operation has failed, a program operation and a verification operation are repeated until the verification operation passes.

By virtue of such control, even if the write operation is terminated at a value lower than the target threshold voltage due to the variation of the process and the circuit at the time of the first program operation, it becomes possible to write an appropriate threshold voltage in the program operation subsequent to the second verification operation and in the verification operation. Consequently, it is possible to improve the threshold voltage distribution width of the memory cell transistors shown by a solid line in FIG. 4, and prevent defective write from occurring.

Second Embodiment

Figure 6:
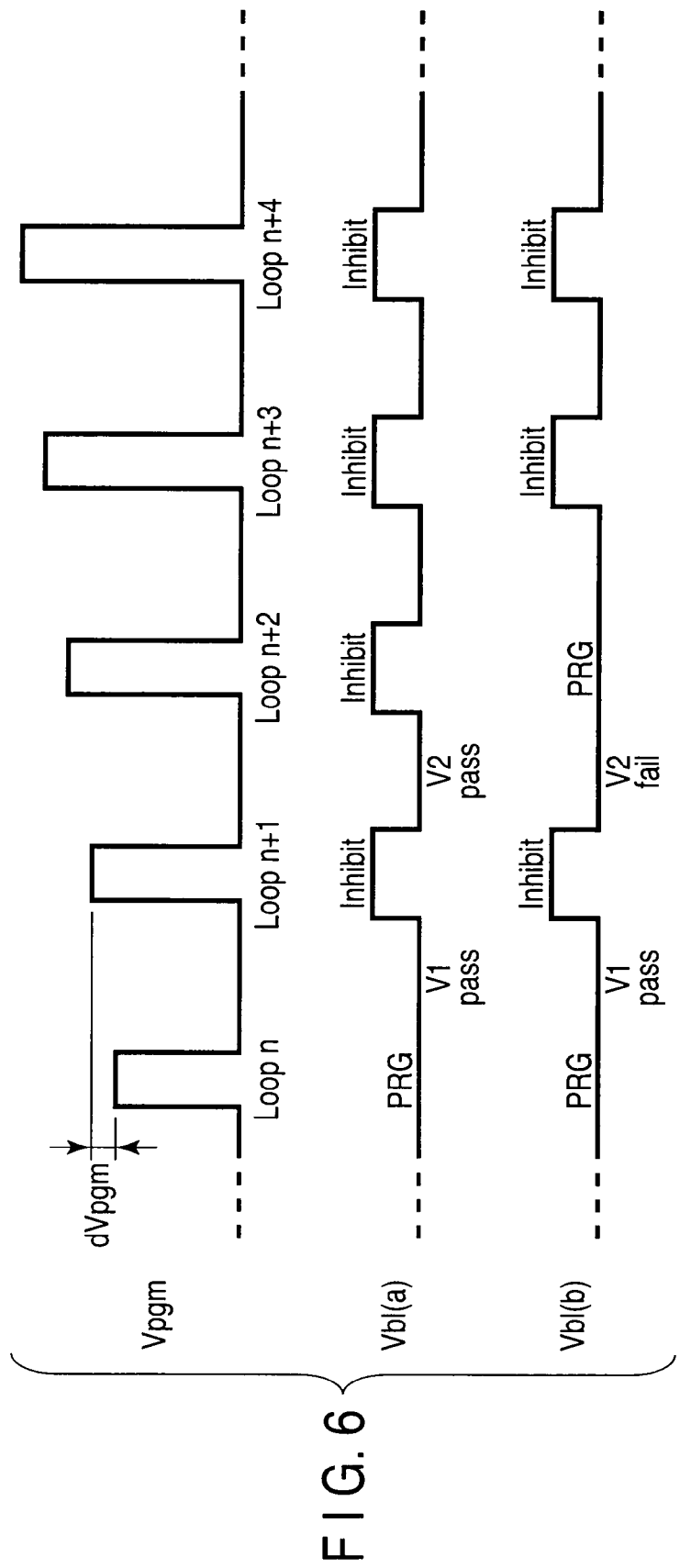
FIG. 6 is a timing chart showing program operations and verification operations in the NAND flash memory according to a second embodiment.

FIG. 6 is a timing chart showing program operations and verification operations in a NAND flash memory according to a second embodiment. As shown by the bit line potential Vbl(a) in FIG. 6, if a first verification operation (V1) carried out after a program operation (first program operation) of the nth loop has completed as in the first embodiment, a program operation (second program operation) of the (n+1)th loop is carried out in the unselected state, and thereafter a second verification operation (V2) is carried out. If the second verification operation (V2) has passed like the first verification operation (V1), no program operation is carried out thereafter.

If, although the first verification operation (V1) has passed at the nth loop, the second verification operation (V2) has failed at the (n+1)th loop, a program operation is carried out at the (n+2)th loop as shown by the bit line potential Vbl(b) in FIG. 6. At this time, the program voltage (Vpgm) has already been stepped up twice with respect to the nth loop, and hence there is a strong possibility of the next verification operation to pass. Accordingly, in this embodiment, as for the memory cell transistor in which the second verification operation (V2) has failed at the (n+1)th loop, the write operation is carried out at the (n+2)th loop, and thereafter the write operation is terminated without carrying out a verification operation.

As described above, in the second embodiment, in addition to the obtained effect identical with that of the first embodiment, if the second verification operation fails, the verification operation to be carried out after the next program operation is skipped to terminate the write operation, and hence it is possible to make the number of verification operations less than in the first embodiment, and make the write speed higher than in the first embodiment.

Third Embodiment

Figure 7:
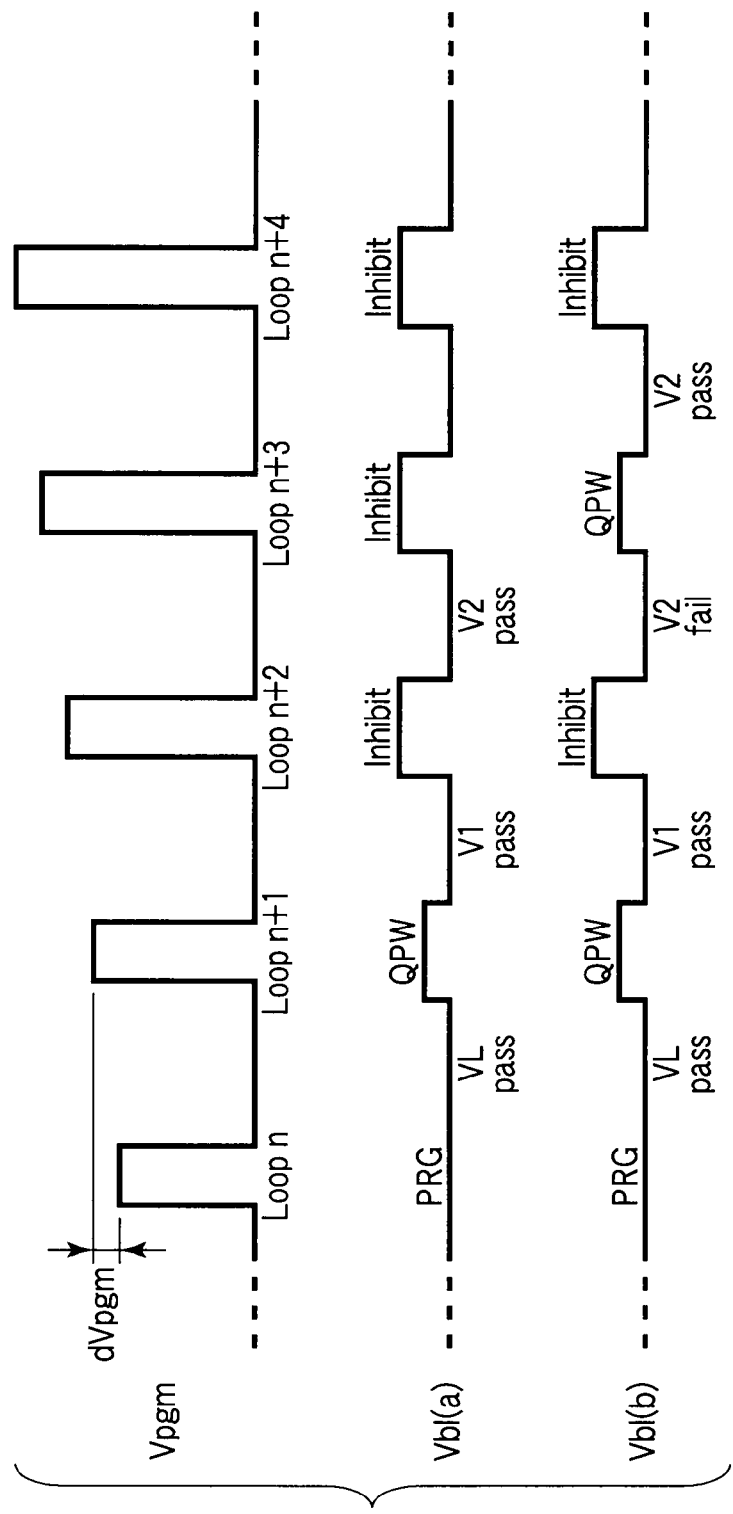
FIG. 7 is a timing chart showing program operations and verification operations in the NAND flash memory according to a third embodiment.

FIG. 7 is a timing chart showing program operations and verification operations in a NAND flash memory according to a third embodiment. This embodiment is an example in which a method (quick-pass write [QPW]) of controlling the threshold voltage distribution width of memory cell transistors narrow by carrying out half-select write by applying a half-select voltage to the bit line BL at the time of the program operation is used in combination with the normal method. Here, the half-select write implies a system in which an intermediate voltage (e.g., 1 V) between 0 V and a voltage close to the power supply voltage is applied to the bit line BL to carry out writing. In the normal program operation, 0 V is applied to a bit line BL for carrying out writing, and a voltage close to the power supply voltage, for example, 3 V is applied to a bit line not for carrying out writing. However, in the QPW, an intermediate voltage of about 1 V is applied to the bit line at the time of the program operation, whereby an effect of providing a feeling that as if the step change voltage (dVpgm) of the program voltage has become smaller in a pseudo manner is obtained.

As shown by the bit line potential Vbl(a) in FIG. 7, after a program operation (first program operation) of the nth loop, a verification operation (VL) is carried out by using a verification low level (second verification level) lower than the normal verification level (first verification level) as the point of reference. Here, the verification low level is lower than the normal verification level by, for example, about half the step change voltage dVpgm of a program voltage at the time of the normal program operation. If the verification operation has passed, a program operation (second program operation) of the (n+1)th loop is carried out by applying a voltage of about 1 V to the bit line BL, and by using the QPW in the half-selected state.

Thereafter, a first verification operation (V1) is carried out by using the normal verification level as the point of reference, and if the first verification operation (V1) has passed, a program operation (third program operation) of the (n+2)th loop is carried out in the unselected state, thereafter a second verification operation (V2) is carried out by using the normal verification level as the point of reference. If the second verification operation has also passed like the first verification operation (V1), no program operation is carried out thereafter. The bit line potential Vbl(a) in FIG. 7 shows an example in which after the verification operation (VL) at the verification low level has passed, the first verification operation (V1) has also passed by the program operation carried out once. However, if the first verification operation (V1) fails, the second program operation and the first verification operation are carried out until the first verification operation (V1) passes.

Further, if the second verification operation (V2) of the (n+2)th loop fails, as shown by the bit line potential Vbl(b) in FIG. 7, a half-select write operation is carried out at the (n+3)th loop, and then the second verification operation (V2) is carried out again. If this second verification operation (V2) fails again, the program operation (half-select write operation) and second verification operation are repeated until the second verification operation (V2) passes. Although the bit line potential Vbl(b) in FIG. 7 shows an example in which the second verification operation (V2) passes by an additional program operation carried out once, actually the program operation (half-select write) and second verification operation are repeated over and over again until the second verification operation (V2) passes.

As described above, in the third embodiment, when the half-select write operation is carried out, the verification operation subsequent to the program operation is carried out once at the verification low level, and twice or more at the normal verification level. Further, as for a cell in which the verification operations of the second and subsequent times fail, it is conceivable that the write operation has not been carried out at the target threshold voltage due to the influence of noise, and there is the possibility of the cell being brought into an over programming state at the next program due to the enhanced electric field, and increased speed. In such a case, it is possible to prevent the cell from being brought into the over programming state by carrying out the next program operation by the half-select write operation to make a write speed slow.

According to the third embodiment, in addition to the obtained effect identical with that of the first embodiment, it is possible to realize a further narrowed threshold voltage distribution width of the memory cell transistors by combining the half-select write operation for narrowing the threshold voltage distribution width of the memory cell transistors, and the write operation for the anti-variation measures.

Fourth Embodiment

Figure 8:
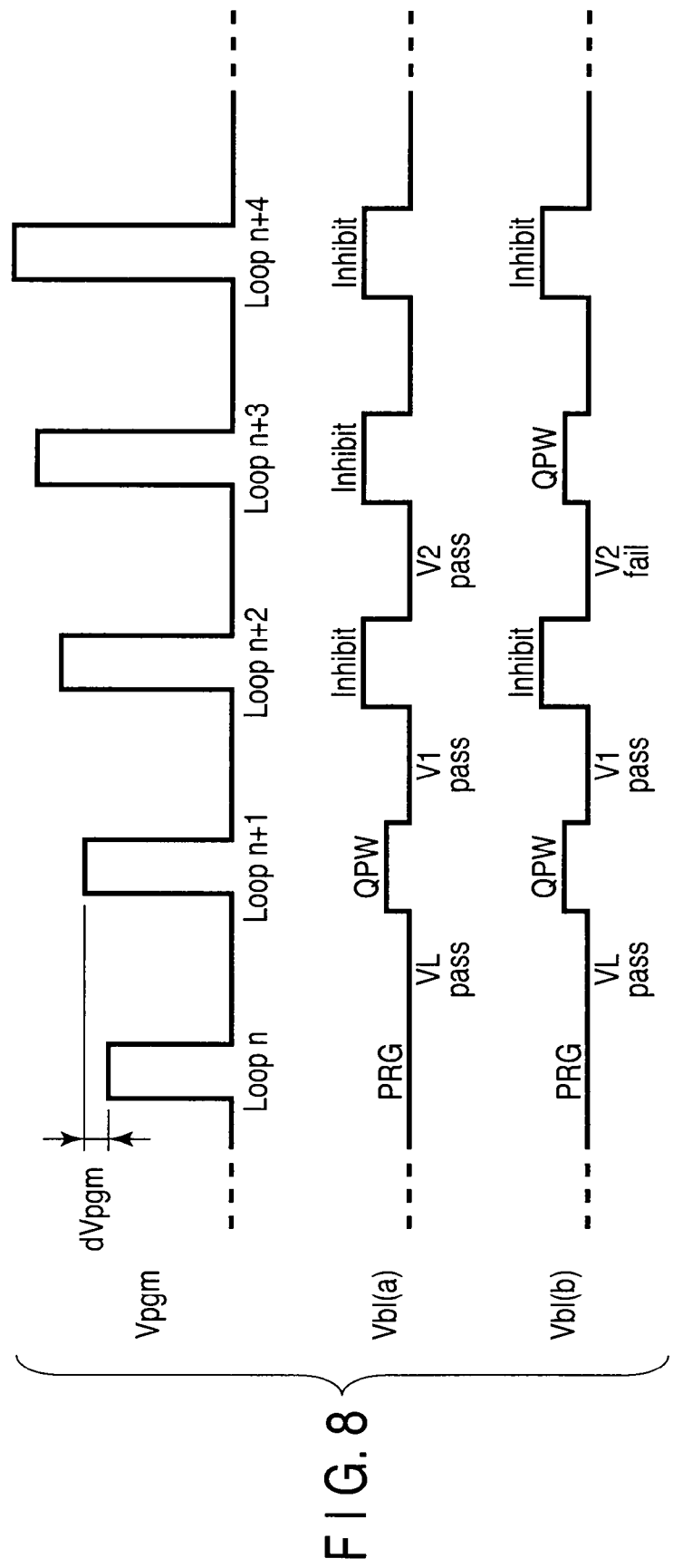
FIG. 8 is a timing chart showing program operations and verification operations in the NAND flash memory according to a fourth embodiment.

FIG. 8 is a timing chart showing program operations and verification operations in a NAND flash memory according to a fourth embodiment. As shown by the bit line potential Vbl(a) in FIG. 8, like in the third embodiment, after a program operation (first program operation) of the nth loop, a verification operation (VL) using the verification low level as the point of reference is carried out, and if the verification operation (VL) passes, a program operation (second program operation) of the (n+1)th loop is carried out by the half-select by applying a voltage of about 1 V to the bit line BL. Thereafter, a first verification operation (V1) using the normal verification level as the point of reference is carried out, then even if the first verification operation (V1) passes, a program operation (third program operation) of the (n+2)th loop is carried out in the unselected state, and thereafter a second verification operation (V2) also using the normal verification level as the point of reference is carried out. If the second verification operation (V2) also passes like the first verification operation (V1), thereafter no program operation is carried out.

If the verification operation (VL) passes at the nth loop, further the first verification operation (V1) passes at the (n+1) th loop, and the second verification operation (V2) of the (n+2)th loop fails, as shown by the bit line potential Vbl(b) in FIG. 8, the half-select write operation is carried out at the (n+3)th loop. At this time, the program voltage Vpgm has already been stepped up twice with respect to the nth loop, and there is a strong possibility of the verification passing. Accordingly, in this embodiment, with respect to the memory cell transistor in which the second verification operation (V2) of the (n+2)th loop has failed, after the half-select write operation is carried out at the (n+3)th loop, no verification operation is carried out, and the write operation is terminated.

As described above, in the fourth embodiment, in addition to the obtained effect identical with that of the third embodiment, if the verification operations of the second and subsequent times fail, the verification operation to be carried out after the next program operation is skipped, and the write operation is terminated, whereby the number of verification operations can be reduced, and the write speed can be increased as compared with the third embodiment.

FIG. 11 is a characteristic diagram showing an example of a relationship between the step-up of the program voltage (Vpgm), and the threshold voltage (Vth) of the memory cell transistor. FIG. 12 is a characteristic diagram showing an example of a state where the actual threshold voltage distribution (broken line) changes (widens) with respect to the ideal threshold voltage distribution (solid line) due to the variation in the step-up of the threshold voltage (Vth) of the memory cell transistor for the step-up of the program voltage (Vpgm).

In the ideal case, as shown by the solid line in FIG. 11, the threshold voltage of the memory cell transistor increases in proportion to the stepwise increase in the program voltage. However, in the actual case, a program operation is quickly carried out or slowly carried out for each step due to the variation of the process and the circuit. As can be seen from the characteristic shown in FIG. 12, at the time of the program operation at a certain program voltage, if an amount of increase in the threshold voltage is smaller than the step-up change amount (dVpgm), and if the next program operation is carried out by stepping up the program voltage, the electric field applied to the tunnel oxide film is enhanced, and hence there is a strong possibility of the increase in the threshold voltage varying more largely than the dVpgm. Fifth and sixth embodiments contrived to improve the above drawback will be described below.

Fifth Embodiment

Figure 9:
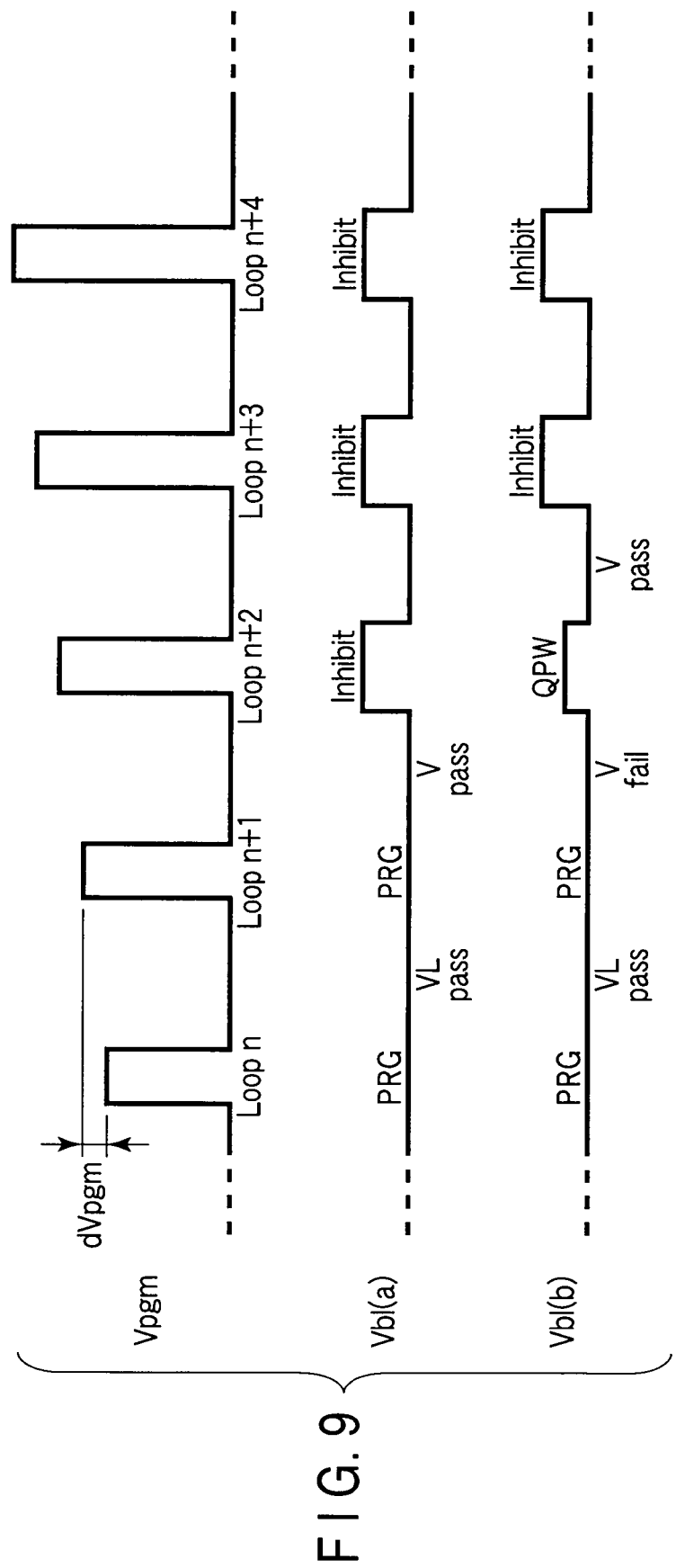
FIG. 9 is a timing chart showing program operations and verification operations in the NAND flash memory according to a fifth embodiment.

FIG. 9 is a timing chart showing program operations and verification operations in a NAND flash memory according to a fifth embodiment. As shown by the bit line potential Vbl(a) in FIG. 9, a verification operation (VL) is carried out after a program operation of the nth loop. Here, the verification low level of the verification operation (VL) is set at a level lower than the target threshold voltage by, for example, half the step-up change amount (dVpgm). If this verification operation (VL) passes, a program operation (first program operation) of the (n+1)th loop is carried out, and thereafter a verification operation (V) using the normal verification level as the point of reference is carried out. If the verification operation (V) passes like the verification operation (VL), thereafter no program operation is carried out.

However, if, although the verification operation (VL) of the nth loop passes, the verification operation (V) of the (n+1)th loop fails, as shown by the bit line potential Vbl(b) in FIG. 9, there is a strong possibility of the threshold voltage variation being smaller than the step-up change amount (dVpgm), and the threshold voltage varying more largely than the step-up change amount at the next program operation of the (n+2)th loop, and hence a write speed is made slow by applying a half-select voltage (for example, 1 V) to the bit line BL at the time of the program operation. Here, although the verification operation (V) passes at the (n+2)th loop, actually, a program operation and a verification operation by the half-select voltage are repeated until the verification operation (V) passes.

As described in the fifth embodiment, a verification low level lower than the normal verification level by, for example, half the dVpgm is set, and if the verification operation (VL) using the verification low level as the point of reference passes, and the verification operation (V) subsequent to the next program operation fails, then the half-select write operation and the verification operation are repeated. As a result of this, it is possible to prevent the high voltage side of the threshold voltage distribution of the memory cell transistors from being widened by the influence of the variation, and obtain the threshold voltage distribution shown by a solid line in FIG. 12.

Sixth Embodiment

Figure 10:
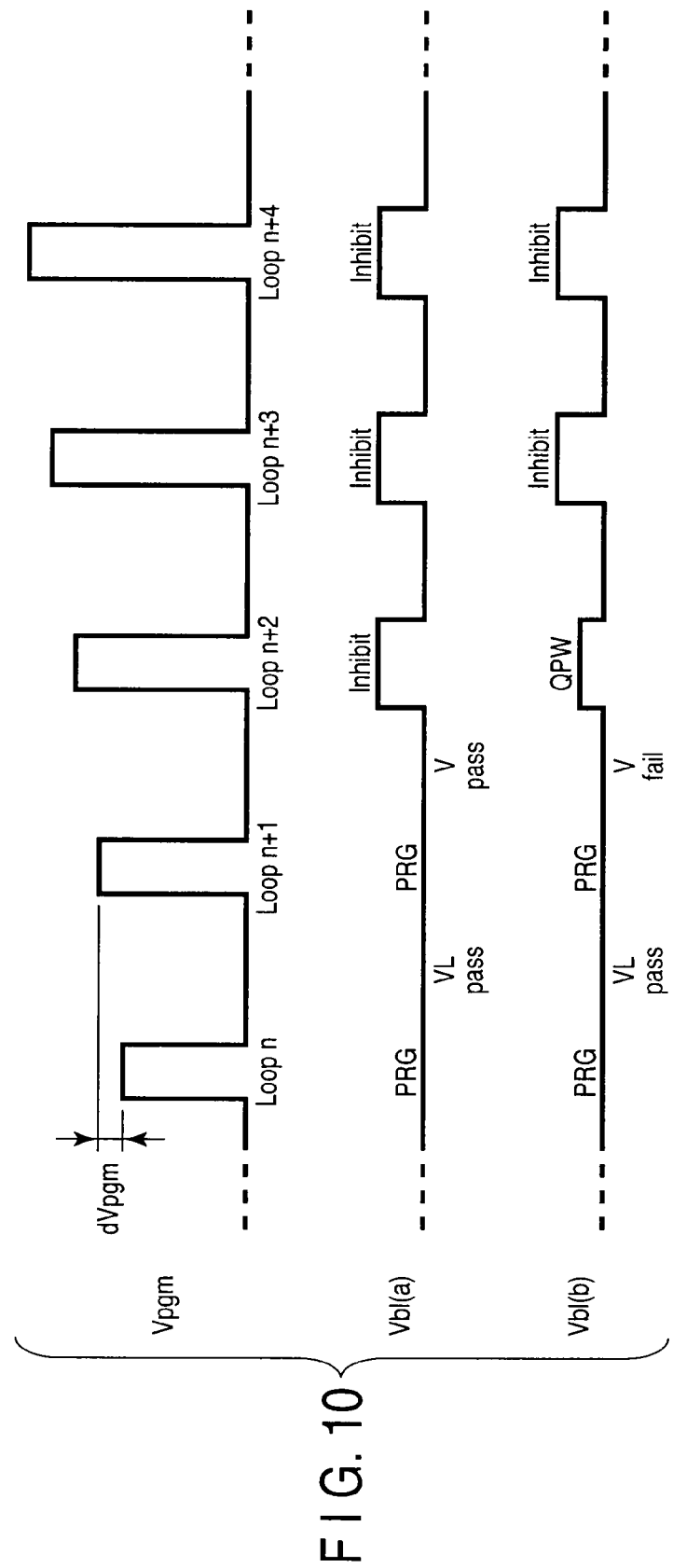
FIG. 10 is a timing chart showing program operations and verification operations in the NAND flash memory according to a sixth embodiment.

FIG. 10 is a timing chart showing program operations and verification operations in a NAND flash memory according to a sixth embodiment. As shown by the bit line potential Vbl(a) in FIG. 10, a verification operation (VL) is carried out after a program operation of the nth loop like in the fifth embodiment. If the verification operation (VL) passes, a verification operation (V) is carried out after a program operation of the (n+1)th loop is carried out. If the verification operation (V) also passes like the verification operation (VL), thereafter no program operation is carried out.

Conversely, if, although the verification operation (VL) of the nth loop passes, the verification operation (V) of the (n+1)th loop fails, as shown by the bit line potential vbl(b) in FIG. 10, there is a strong possibility of the write operation being terminated at the program operation of the (n+2)th loop, hence half-select write operation is carried out at the (n+2)th loop, thereafter the verification operation is skipped, and then the write operation is terminated.

As described above, in the sixth embodiment, in addition to the obtained effect identical with that of the fifth embodiment, if the verification operation (V) fails, then the half-select write operation is carried out once, a verification operation is skipped, then the write operation is terminated, and hence it is possible to increase the write speed as compared with the fifth embodiment.

Next, the operation of the sense amplifier & data latch 30 in FIG. 3 in each of the above embodiments will be described below.

Operations of First and Second Embodiments

First, a program operation and verification operation (V1) are carried out in accordance with the data input to the latches DL1, DL2. If the verification operation (V1) passes, binary 0 is written to the latch DL4 as a flag. Then, if data is present in each of the latches DL1, DL2, and DL4 (binary 0), a program operation is skipped, and a verification operation (V2) is carried out. If the verification operation (V2) passes, all the latches DL1, DL2, and DL3 are made binary 1 (erased) to terminate the write operation, and if the verification operation (V2) fails, binary 0 is written to the latch DL3. If no data is present in all the latches DL1, DL2, and DL4 (binary 1), no further write operation is carried out.

Then, if data is present in each of the latches DL1, DL2, DL3, and DL4, in the first embodiment, the program operation and the verification operation (V2) are carried out until the verification operation (V2) passes. On the other hand, in the second embodiment, only the program operation is carried out once, then each of the latches DL1, DL2, DL3, and DL4 is made binary 1, and the write operation is terminated.

Operations of Third and Fourth Embodiments

First, a program operation and verification operation (VL) are carried out in accordance with the data of the latches DL1, DL2. If the verification operation (VL) passes, binary 0 is written to the latch DL3 as a flag. Then, if data is present in each of the latches DL1, DL2, and DL3, after carrying out a program operation (half-select write operation) by applying a half-select voltage to the bit line BL, a verification operation (V1) is carried out. If the verification operation (V1) passes, the latch DL3 is made binary 1 to erase the latch DL3, and binary 0 is written to the latch DL4. Then, if data is present in each of the latches DL1, DL2, and DL4, the program operation is skipped, and a verification operation (V2) is carried out. If the verification operation (V2) passes, each of the latches DL1, DL2, and DL4 is made binary 1 to terminate the write operation, and if the verification operation (V2) fails, binary 0 is written to the latch DL3. If no data is present in all the latches DL1, DL2, and DL4, no further write operation is carried out.

Then, if data is present in each of the latches DL1, DL2, DL3, and DL4, in the third embodiment, the program operation and the verification operation (V2) are carried out until the verification operation (V2) passes. On the other hand, in the fourth embodiment, only the program operation is carried out once, and each of the latches DL1, DL2, DL3, and DL4 is made binary 1, and the write operation is terminated.

Operations of Fifth and Sixth Embodiments

First, a program operation and verification operation (VL) are carried out in accordance with the data of the latches DL1, DL2. If the verification operation (VL) passes, binary 0 is written to the latch DL4 as a flag. Then, if data is present in the latches DL1, DL2, and DL4, a program operation and verification operation (V) are carried out. If the verification operation (V) passes, each of the latches DL1, DL2, and DL4 is made binary 1 to terminate the write operation, and if the verification operation (V) fails, binary 0 is written to the latch DL3. If no data is present in all the latches DL1, DL2, and DL4, no further write operation is carried out.

Then, if data is present in each of the latches DL1, DL2, DL3, and DL4, in the fifth embodiment, the program operation and the verification operation (V) are carried out until the verification operation (V) passes. On the other hand, in the sixth embodiment, only the program operation is carried out once, then each of the latches DL1, DL2, DL3, and DL4 is made binary 1, and the write operation is terminated.

It should be noted that the operations in the first, second, third, and fourth embodiments described previously are enabled even if, in FIG. 2, the configuration is changed to a configuration in which a plurality of bit lines BL share one sense amplifier & data latch 30 with each other.

It should be noted that although in each of the above embodiments, the case where the present invention is applied to a NAND flash memory has been described, the present invention can also be applied to other non-volatile semiconductor memories such as a NOR flash memory, and the like in some cases, and can be appropriately modified and implemented within the scope not deviating from the gist of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A non-volatile semiconductor memory device comprising:
   a memory cell array in which a plurality of memory cell transistors are arranged; and
   a write controller configured to control in a write operation that a verification operation subsequent to a program operation is carried out with a program voltage increasing stepwise for each program operation, wherein the write controller controls that a first verification operation is carried out at a first verification level for a memory cell transistor to be written, subsequently to the first verification operation, a program operation is carried out with the memory cell transistor set in an unselected state, and a verification operation for the memory cell transistor subsequent to the program operation is carried out as a second verification operation at the first verification level.

2. The non-volatile semiconductor memory device according to claim 1, wherein if the second verification operation fails, the write controller controls that a program operation with the memory cell transistor set in a selected state, and the second verification operation subsequent to the program operation are repeatedly carried out a plurality of times until the second verification operation passes.

3. The non-volatile semiconductor memory device according to claim 1, wherein if the second verification operation fails, the write controller controls that a program operation with the memory cell transistor set in a selected state is carried out further only once, the second verification operation subsequent thereto is skipped to terminate the write operation.

4. The non-volatile semiconductor memory device according to claim 1, wherein the first verification operation is a verification operation carried out after a first program operation by which a threshold voltage of a memory cell transistor to be written has become equal to or higher than the first verification level for the first time.

5. The non-volatile semiconductor memory device according to claim 4, wherein if the second verification operation fails, the write controller controls that a program operation with the memory cell transistor set in a selected state, and the second verification operation subsequent to the program operation are repeatedly carried out a plurality of times until the second verification operation passes.

6. The non-volatile semiconductor memory device according to claim 4, wherein if the second verification operation fails, the write controller controls that a program operation with the memory cell transistor set in a selected state is carried out further only once, the second verification operation subsequent thereto is skipped to terminate the write operation.

7. A non-volatile semiconductor memory device comprising:

a memory cell array in which a plurality of memory cell transistors are arranged; and a write controller configured to control in a write operation that a verification operation subsequent to a program operation is carried out with a program voltage increasing stepwise for each program operation, a half-select write operation is carried out in a half-selected state where a given intermediate voltage lower than the power supply voltage is applied to a bit line connected to the memory cell transistor, and a first verification level, and a second verification level lower than the first verification level are set, wherein the write controller controls that a program operation subsequent to a first program operation that is a program operation by which a threshold voltage of a memory cell transistor to be written has become equal to or higher than the second verification level for the first time is carried out as a second program operation by the half-select write operation, a verification operation subsequent thereto is carried out as a first verification operation by using the first verification level as a point of reference, further a third program operation is carried out with the memory cell transistor to be written set in an unselected state, and a verification operation subsequent thereto is carried out as a second verification operation by using the first verification level as the point of reference.

8. The non-volatile semiconductor memory device according to claim 7, wherein if the second verification operation fails, the write controller controls that a program operation with the memory cell transistor set in the half-selected state, and the second verification operation are repeatedly carried out a plurality of times until the second verification operation passes.

9. The non-volatile semiconductor memory device according to claim 7, wherein if the second verification operation fails, the write controller controls that a program operation with the memory cell transistor set in the half-selected state is carried out only once, the second verification operation subsequent thereto is skipped to terminate the write operation.

10. A non-volatile semiconductor memory device comprising:

a memory cell array in which a plurality of memory cell transistors are arranged; and a write controller configured to control in a write operation that a verification operation subsequent to a program operation is carried out with a program voltage increasing stepwise for each program operation, a half-select write operation is carried out in a state where a predetermined intermediate voltage lower than the power supply voltage is applied to a bit line connected to the memory cell transistor, and a first verification level, and a second verification level lower than the first verification level are set, wherein the write controller controls that a verification operation subsequent to a program operation carried out for a memory cell transistor subsequently to a program operation by which a threshold voltage of the memory cell transistor of a write object has become equal to or higher than the second verification level for the first time is carried out by using the first verification level as a point of reference, and if the verification operation fails, a program operation is carried out by a half-select write operation to be carried out in a half-selected state where a given intermediate voltage lower than the power supply voltage is applied to a bit line connected to the memory cell transistor.

11. The non-volatile semiconductor memory device according to claim 10, wherein the write controller controls that a verification operation is carried out by using the first verification level as a point of reference after the program operation carried out by the half-select write.

12. The non-volatile semiconductor memory device according to claim 10, wherein the write controller controls that after the program operation carried out by the half-select write operation, a verification operation to be carried out by using the first verification level as a point of reference is skipped to terminate the write operation.

* * * * *